United States Patent
Chiang et al.

(10) Patent No.: US 10,121,870 B1
(45) Date of Patent: Nov. 6, 2018

(54) SEMICONDUCTOR DEVICE STRUCTURE WITH STRAIN-RELAXED BUFFER

(71) Applicant: Taiwan Semiconductor Manufacturing Co., Ltd., Hsinchu (TW)

(72) Inventors: Hung-Li Chiang, Taipei (TW); I-Sheng Chen, Taipei (TW); Tzu-Chiang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,169

(22) Filed: Aug. 31, 2017

(51) Int. Cl.
| | |
|---|---|
| *H01L 21/70* | (2006.01) |
| *H01L 29/423* | (2006.01) |
| *H01L 29/06* | (2006.01) |
| *H01L 29/66* | (2006.01) |
| *H01L 29/78* | (2006.01) |

(52) U.S. Cl.
CPC ...... *H01L 29/4238* (2013.01); *H01L 29/0676* (2013.01); *H01L 29/42376* (2013.01); *H01L 29/66439* (2013.01); *H01L 29/66469* (2013.01); *H01L 29/7827* (2013.01)

(58) Field of Classification Search
CPC ............. H01L 29/4238; H01L 29/0676; H01L 29/42376; H01L 29/66439; H01L 29/66469; H01L 29/7827; H01L 29/0669; H01L 29/413; H01L 2221/1094; H01L 21/02603; H01L 29/7378; H01L 29/7847; H01L 29/1054

USPC ................ 977/762, 938; 257/288, 368, 369; 438/151, 197, 199
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2014/0299934 A1* | 10/2014 | Kim .................... | H01L 29/7848 257/347 |

(Continued)

*Primary Examiner* — Shahed Ahmed
(74) *Attorney, Agent, or Firm* — McClure, Qualey & Rodack, LLP

(57) ABSTRACT

Semiconductor device structures are provided. The semiconductor device structure includes a fin structure over a semiconductor substrate. The semiconductor device structure also includes semiconductor wires stacked over the fin structure. The semiconductor device structure further includes a gate stack over the fin structure. The semiconductor wires are surrounded by the gate stack. In addition, the semiconductor device structure includes source or drain structures over the fin structure and on opposite sides of the semiconductor wires. The semiconductor device structure also includes strain-relaxed buffer structures between the source or drain structures and the fin structure. The strain-relaxed buffer structures and the semiconductor wires have different lattice constants.

20 Claims, 20 Drawing Sheets

(56) References Cited

U.S. PATENT DOCUMENTS

2015/0179798 A1\* 6/2015 Clendenning ....... H01L 29/7851
                                                                            257/401
2017/0053825 A1\* 2/2017 Seo ................... H01L 21/31144
2017/0229555 A1\* 8/2017 Balakrishnan ...... H01L 29/0673

\* cited by examiner

US 10,121,870 B1

SEMICONDUCTOR DEVICE STRUCTURE WITH STRAIN-RELAXED BUFFER

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with nanowires, has been introduced to replace a planar transistor. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
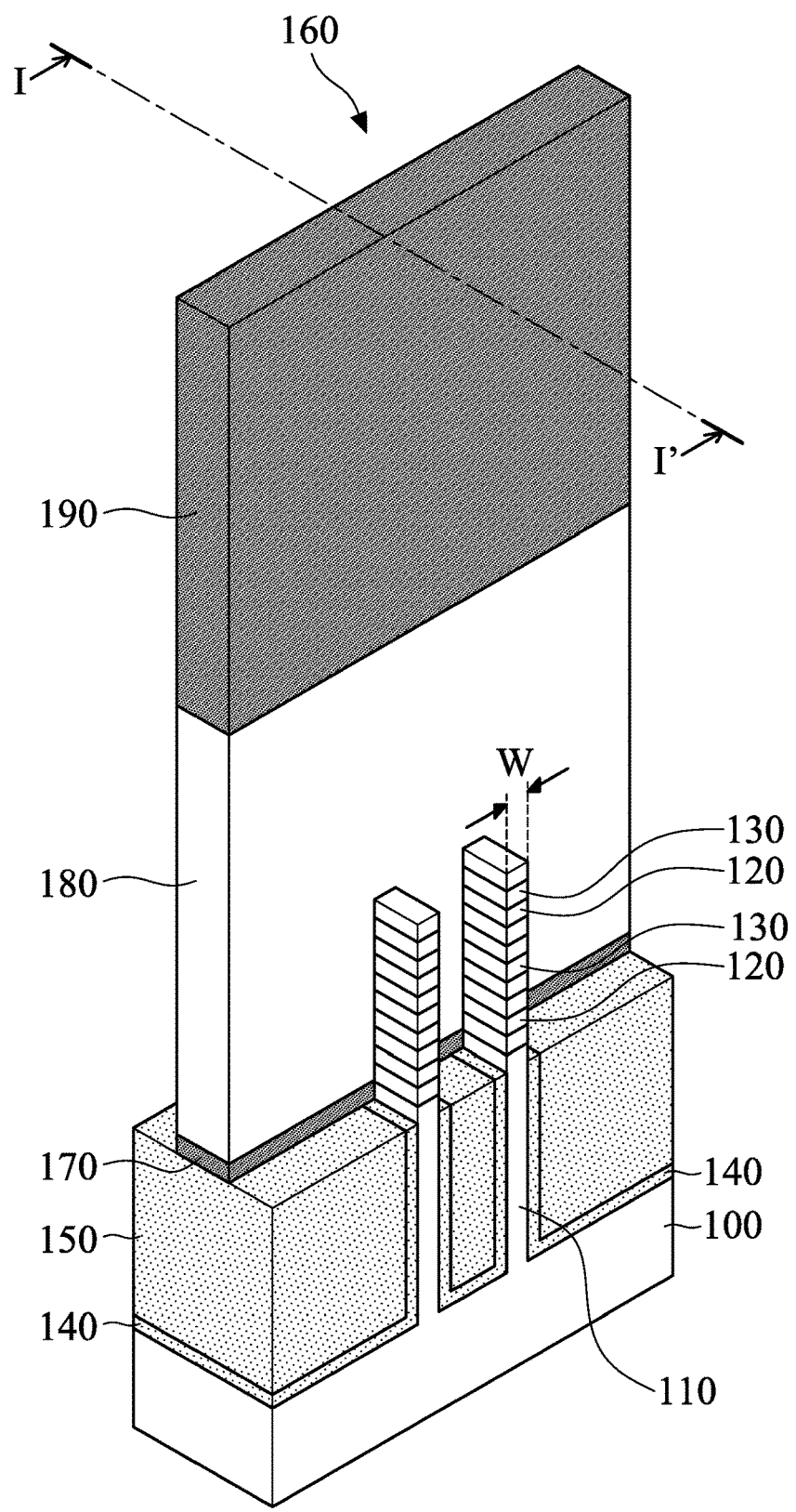
FIGS. 1A, 2A, 3A, 4A, 5A, 6A, 7A and 8A are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and they are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with gate all around (GAA) transistor structures. The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A, 2A, 3A, 4A, 5A, 6A, 7A and 8A are perspective views of various stages of a process for forming a semiconductor device structure, in accordance with some embodiments. FIG. 1B is a cross-sectional view of the semiconductor device structure taken along a sectional line I-I' shown in FIG. 1A, in accordance with some embodiments. Similarly, FIGS. 2B, 3B, 4B, 5B, 6B, 7B and 8B are cross-sectional views of the semiconductor device structure shown in FIGS. 2A, 3A, 4A, 5A, 6A, 7A and 8A, respectively. For illustration purposes, the sectional lines are not shown in FIGS. 2A, 3A, 4A, 5A, 6A, 7A and 8A.

Figure 1B:
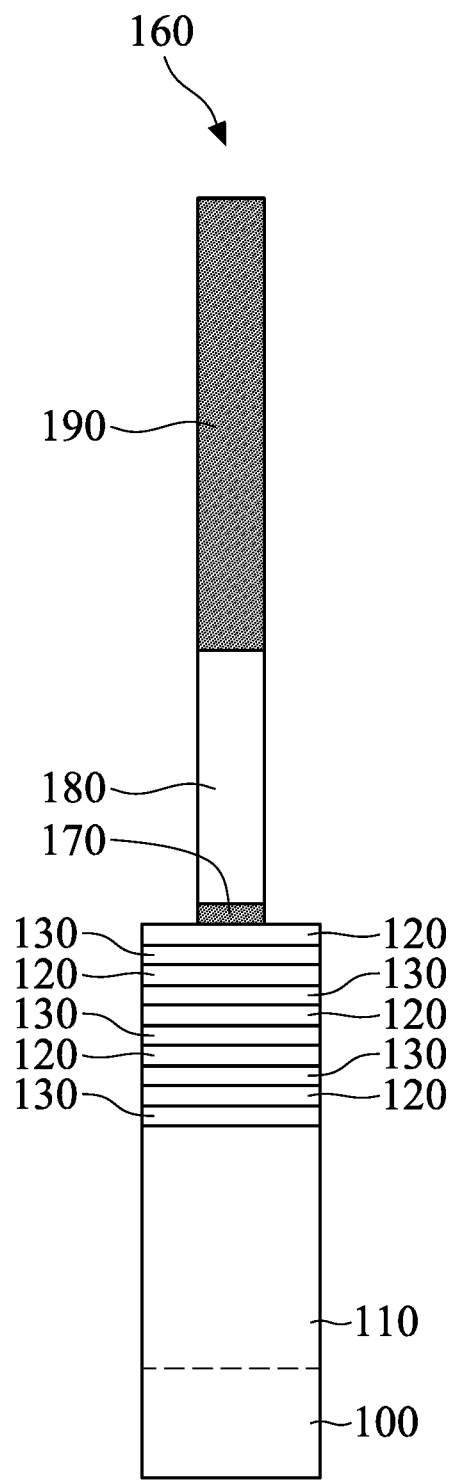
FIGS. 1B, 2B, 3B, 4B, 5B, 6B, 7B and 8B are cross-sectional views of various stages of a process for forming a semiconductor device structure, in accordance with some embodiments.

As shown in FIGS. 1A and 1B, a semiconductor substrate 100 is provided. In some embodiments, the semiconductor substrate 100 is a bulk semiconductor substrate, such as a semiconductor wafer. The semiconductor substrate 100 may include silicon or another elementary semiconductor material (such as germanium) in a single crystal, polycrystal, or amorphous structure. In some other embodiments, the semiconductor substrate 100 includes a compound semiconductor. The compound semiconductor may include germanium tin, gallium arsenide, silicon carbide, another suitable compound semiconductor, or a combination thereof. In some embodiments, the semiconductor substrate 100 includes a semiconductor-on-insulator (SOI) substrate.

As shown in FIGS. 1A and 1B, the semiconductor substrate 100 includes fin structures 110. Multiple semiconductor wires 120 and 130 are alternately formed over each of the fin structures 110, in accordance with some embodiments. In some embodiments, the width W of the semiconductor wires 120 and 130 is in a range from about 3 nm to about 10 nm. The semiconductor wires 120 and 130 may or may not have substantially the same thickness or height. The numbers of the semiconductor wires 120 and 130 are not limited to those shown in FIGS. 1A and 1B.

In some embodiments, the semiconductor wires 120 and 130 are made of or include silicon, silicon germanium, germanium tin, silicon germanium tin, or another suitable semiconductor material. In some embodiments, the semiconductor wires 120 are made of a different material than that of the semiconductor wires 130. In some embodiments, the semiconductor wires 120 are made of silicon, and the semiconductor wires 130 are made of silicon germanium. In some embodiments, the semiconductor wires 120 and 130 are formed using an epitaxial growth process, such as a selective epitaxial growth (SEG) process, a chemical vapor deposition (CVD) process (e.g., a vapor-phase epitaxy (VPE) process, a low pressure CVD process, and/or an ultra-high vacuum CVD process), a molecular beam epitaxy process, other applicable processes, or a combination thereof.

As shown in FIGS. 1A and 1B, isolation features 150 are formed over the semiconductor substrate 100, in accordance with some embodiments. The isolation features 150 surround the fin structures 110 without surrounding the semiconductor wires 120 and 130. The isolation features 150 are used to define and electrically isolate various device elements formed in and/or over the semiconductor substrate 100. For example, the isolation features 150 may be used to separate two neighboring field effect transistors (FETs). In some embodiments, the isolation features 150 include shallow trench isolation (STI) features, local oxidation of silicon (LOCOS) features, other suitable isolation features, or a combination thereof.

In some embodiments, an isolation liner 140 is formed between the semiconductor substrate 100 and the isolation features 150. The isolation liner 140 reduces defects at the interface between the semiconductor substrate 100 and the isolation features 150, such as the interface between the fin structures 110 and the isolation features 150. Many variations and modifications can be made to embodiments of the disclosure. In some other embodiments, the isolation liner 140 is not formed.

Afterwards, multiple dummy or sacrificial gate stacks are formed over the semiconductor substrate 100, in accordance with some embodiments. One dummy gate stack 160 is shown in FIGS. 1A and 1B as an example. The dummy gate stack 160 partially covers the semiconductor wires 120 and 130 and the isolation features 150.

In some embodiments, the dummy gate stack 160 includes a dummy dielectric layer 170, a dummy gate electrode 180, and a hard mask 190. The dummy dielectric layer 170 is in direct contact with the semiconductor wires 120 and 130 and the isolation features 150, in accordance with some embodiments. In some embodiments, the dummy dielectric layer 170 is made of a dielectric material, such as silicon oxide.

In some embodiments, the dummy gate electrode 180 is made of polysilicon. The dummy gate electrode 180 will be replaced with another conductive material (such as a metal material). The hard mask 190 is used to assist in the patterning process for forming the dummy gate stack 160. In some embodiments, the hard mask 190 is made of silicon oxide, silicon nitride, silicon oxynitride, silicon carbide, another suitable material, or a combination thereof. In some embodiments, the hard mask 190 has a multi-layer structure. Many variations and modifications can be made to embodiments of the disclosure. In some other embodiments, the hard mask 190 is not formed.

Figure 2A:
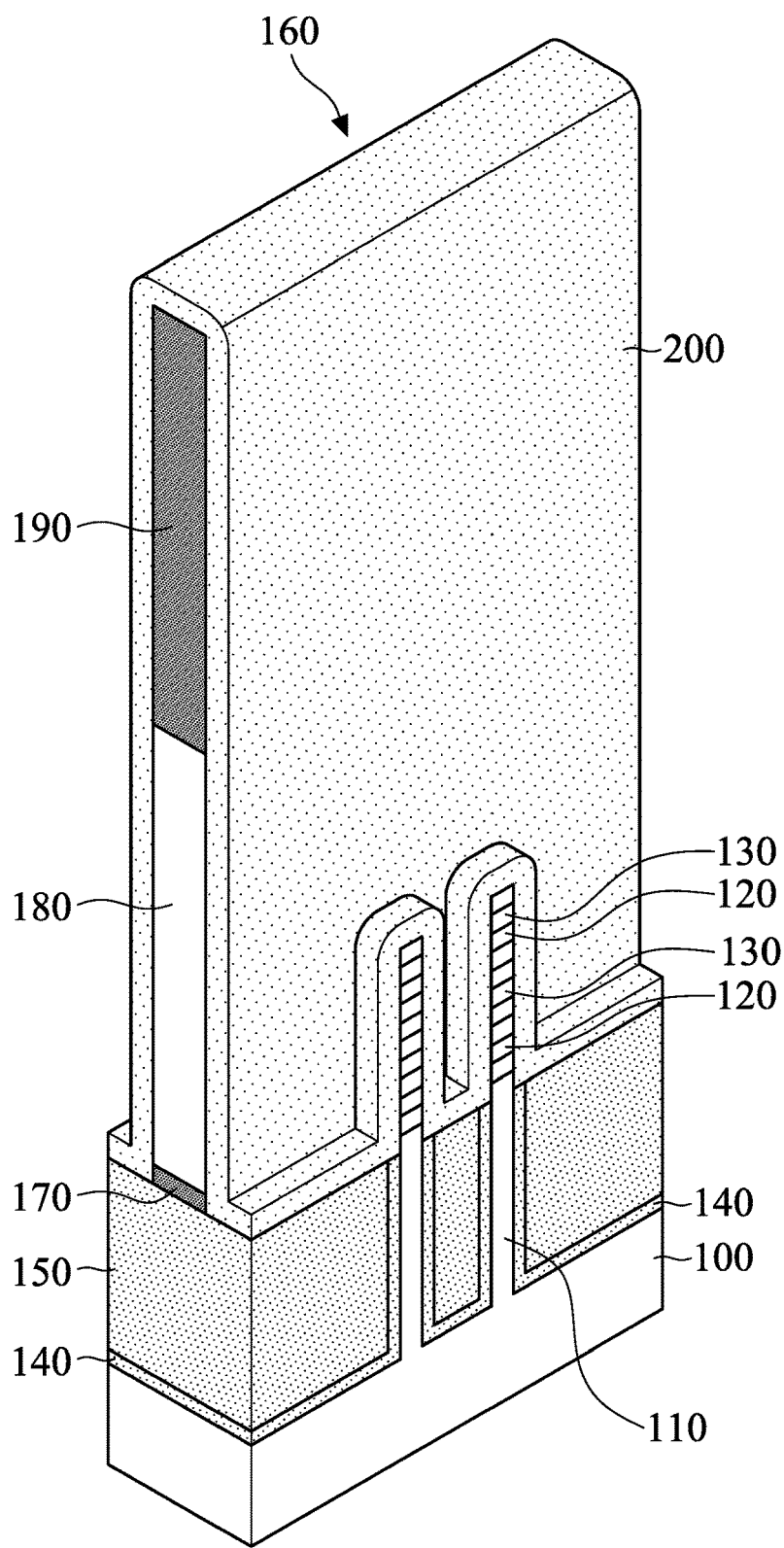
Figure 2B:
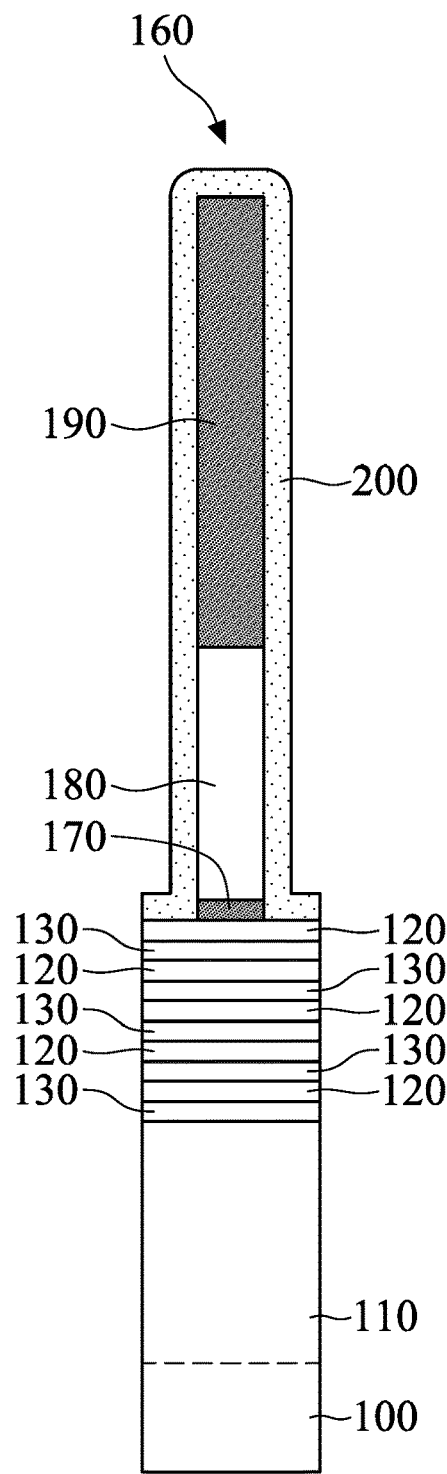

As shown in FIGS. 2A and 2B, a spacer layer 200 is conformally deposited over the dummy gate stack 160, the semiconductor wires 120 and 130 and the isolation features 150, in accordance with some embodiments. The spacer layer 200 is made of a dielectric material. The dielectric material may include silicon nitride, silicon carbon nitride, silicon oxynitride, silicon carbide, another suitable dielectric material, or a combination thereof. The spacer layer 200 is deposited using a CVD process, a physical vapor deposition (PVD) process, a spin-on process, another applicable process, or a combination thereof.

Figure 3A:
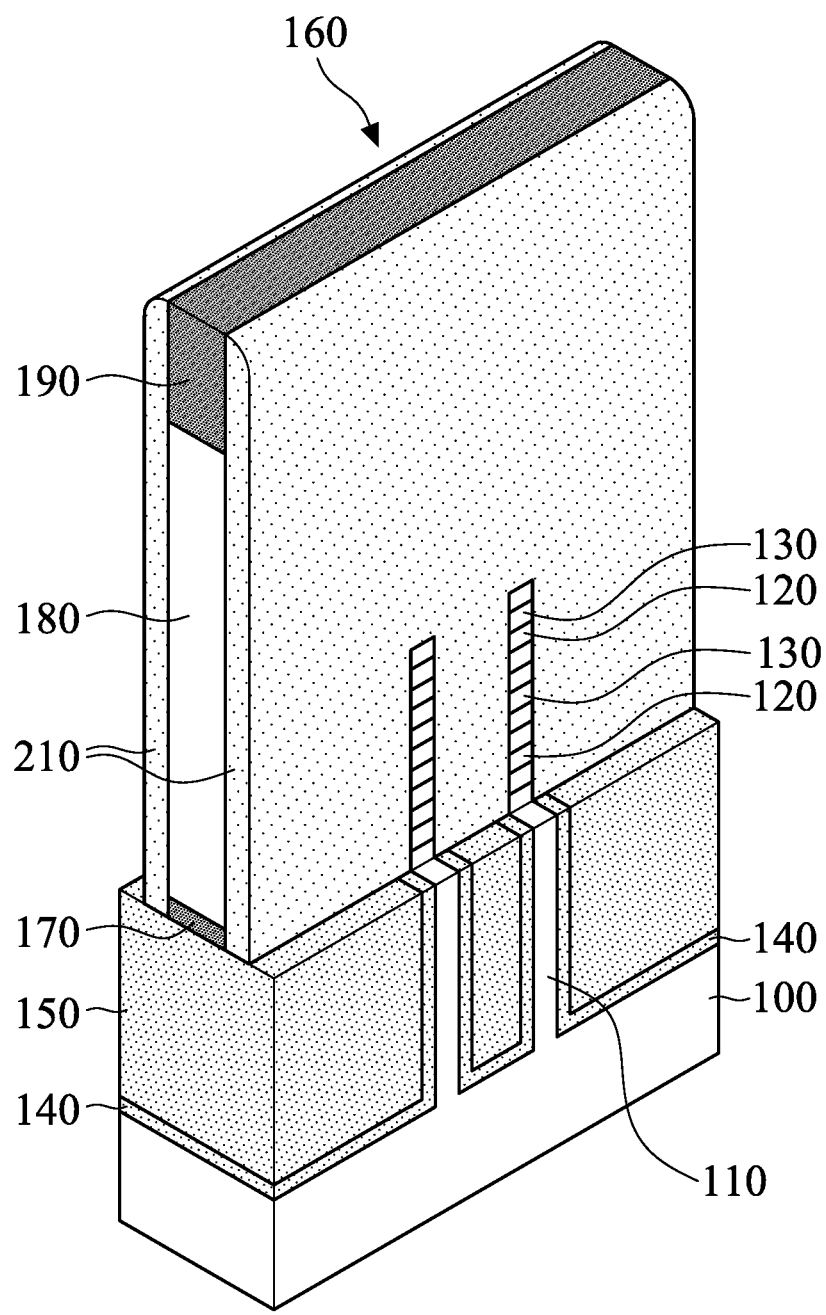
Figure 3B:
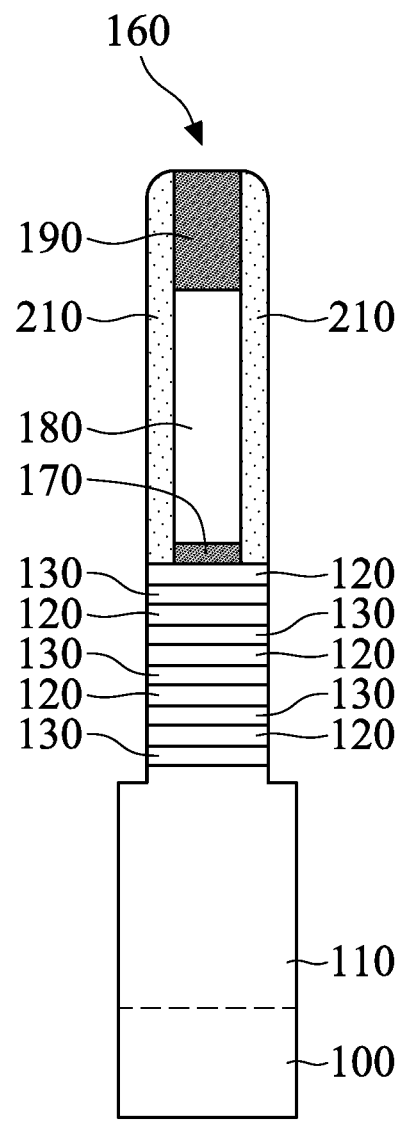

Afterwards, an etching process, such as an anisotropic etching process, is performed to partially remove the spacer layer 200. As a result, the remaining portions of the spacer layer 200 over the sidewalls of the dummy gate stack 160 form spacer elements 210, as shown in FIGS. 3A and 3B. The spacer elements 210 are positioned on two opposite sides of the dummy gate stack 160. In some embodiments, the spacer elements 210 expose the semiconductor wires 120 and 130 and the isolation features 150.

Subsequently, the portions of the semiconductor wires 120 and 130 that are not under the dummy gate stack 160 and the spacer elements 210 are removed, as shown in FIGS. 3A and 3B in accordance with some embodiments. As a result, space is created for a subsequent formation process of source or drain structures/regions (which will be described in more detail later). The semiconductor wires 120 and 130 become narrower than the fin structures 110. In some embodiments, an etching process is used to partially remove the semiconductor wires 120 and 130. The fin structures 110 become exposed after the etching process.

Figure 4A:
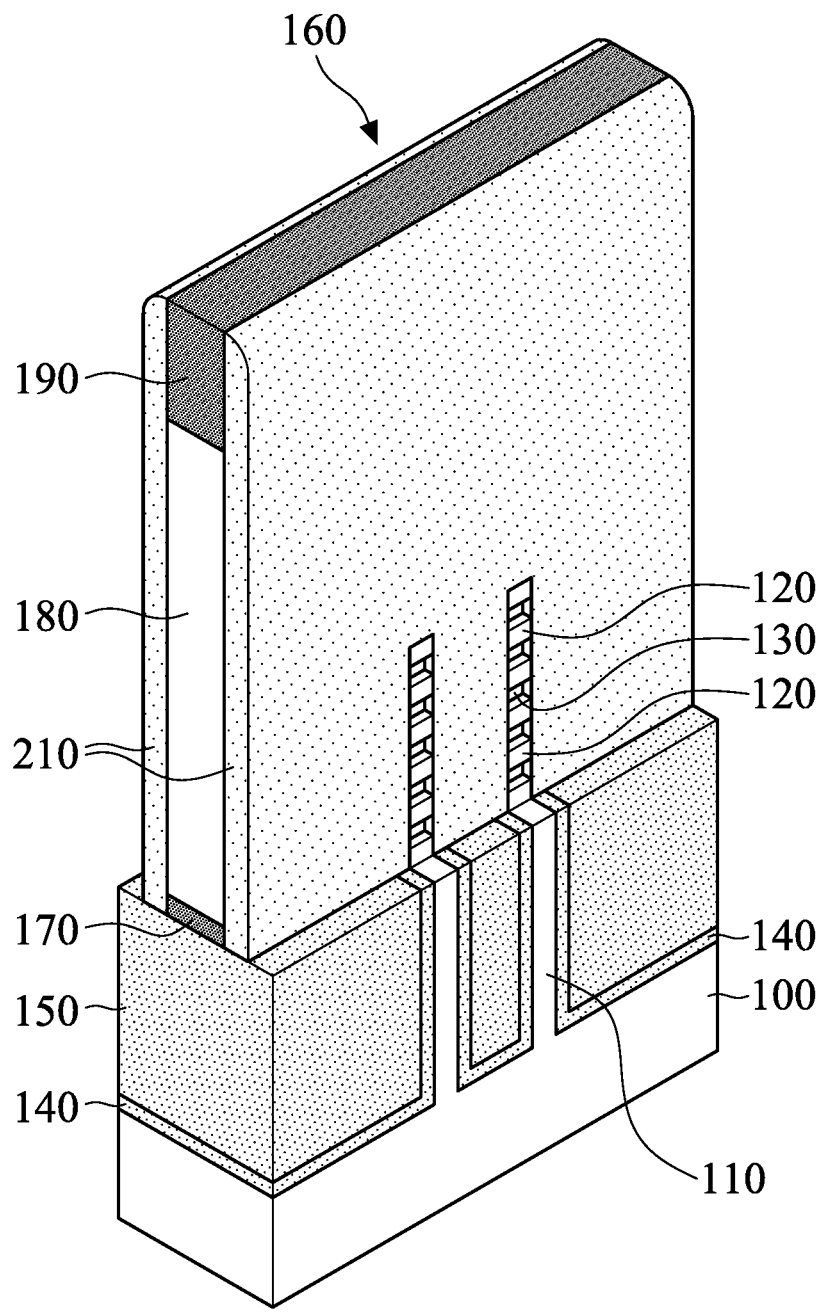
Figure 4B:
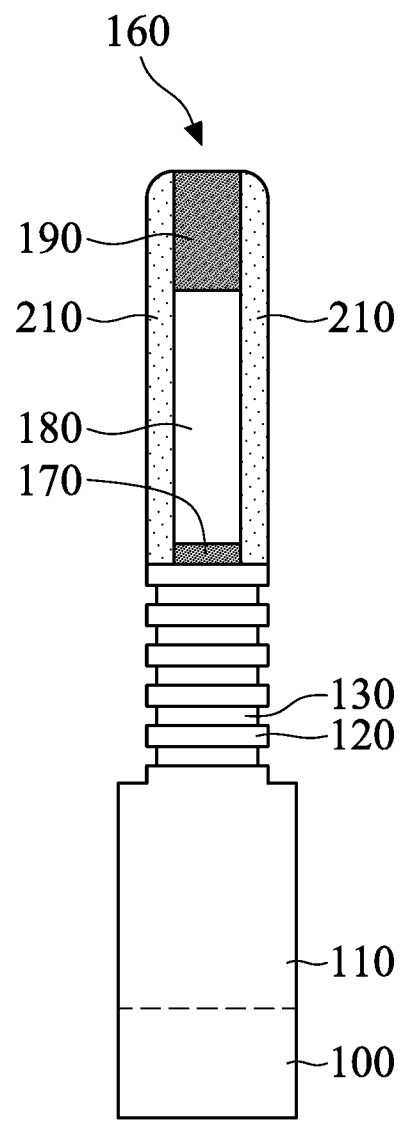

As shown in FIGS. 4A and 4B, the semiconductor wires 130 are partially removed and become narrower, in accordance with some embodiments. In some embodiments, an etching process is performed to selectively remove portions of the semiconductor wires 130 without removing the semiconductor wires 120. In some embodiments, the etching process includes a wet etching process, a dry etching process, or another suitable etching process. In some embodiments, the etchant used in the etching process includes a liquid mixture. The liquid mixture may include $NH_4OH$, ammonia-peroxide mixture, tetramethyl ammonium hydroxide, another suitable solution, or a combination thereof. In some other embodiments, the etchant used in the etching process includes a gas mixture. The gas mixture may include $CF_4$, $SF_6$, $CH_3F$, another suitable gas, or a combination thereof. In some embodiments, the etchant has a sufficiently high etch selectivity of the semiconductor wires 130 to the semiconductor wires 120. As a result, the semiconductor wires 130 are etched much faster than the semiconductor wires 120.

Figure 5A:
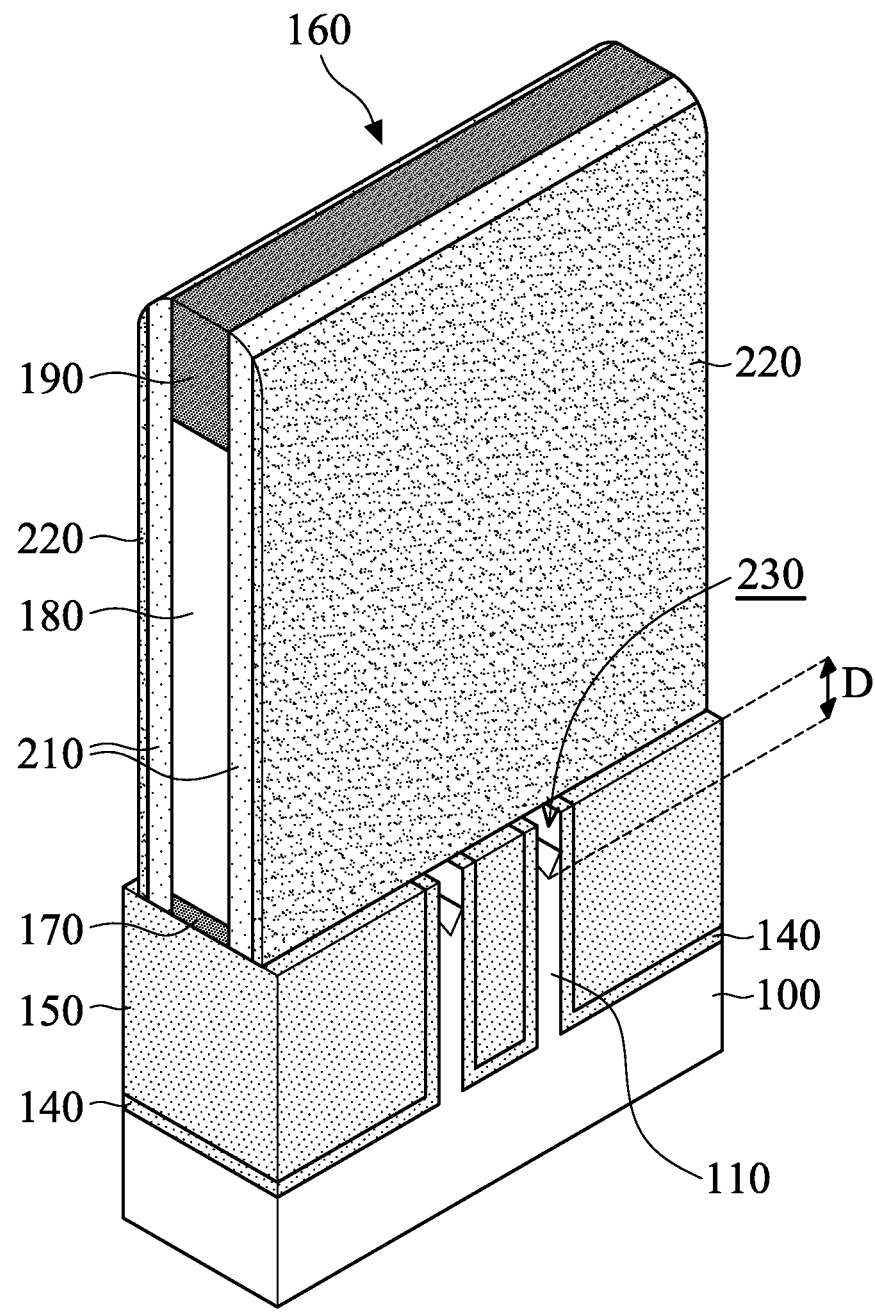
Figure 5B:
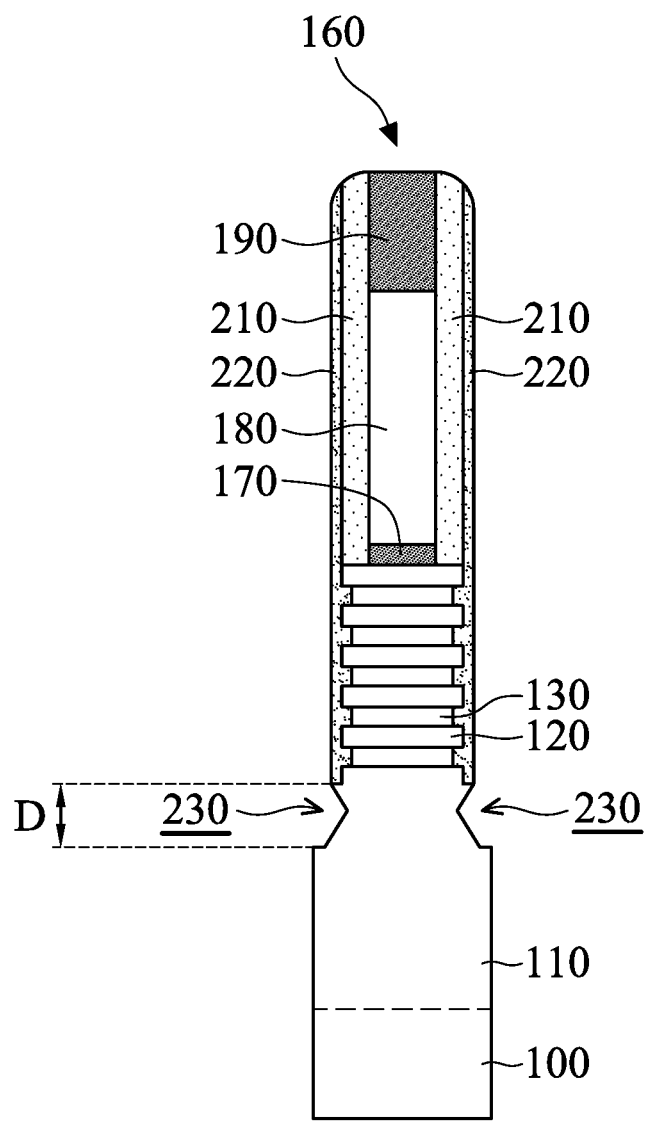

As shown in FIGS. 5A and 5B, spacer elements 220 are formed over the sidewalls of the spacer elements 210 and the semiconductor wires 120 and 130, in accordance with some embodiments. The spacer elements 220 further fill into the space (or recess) that is formed due to the partial removal of the semiconductor wires 130, as described in FIGS. 4A and 4B. As a result, portions of the spacer elements 220 extend between the semiconductor wires 120, as shown in FIGS. 5A and 5B. The portions of the spacer elements 220 may serve as an etch stop layer during subsequent etching processes to protect source or drain structures.

In some embodiments, a spacer layer (not shown) is conformally deposited over the dummy gate stack 160, the spacer elements 210 and the isolation features 150. The spacer layer is made of a dielectric material. The dielectric material may include silicon nitride, silicon carbon nitride, silicon oxynitride, low-K dielectric material, another suitable dielectric material, or a combination thereof. Afterwards, an etching process, such as an anisotropic etching process, is performed to partially remove the spacer layer. As a result, the remaining portions of the spacer layer over the sidewalls of the spacer elements 210 and the semiconductor wires 120 and 130 form the spacer elements 220. In some embodiments, the spacer elements 220 expose the fin structures 110 and the isolation features 150.

In some embodiments, the spacer elements 220 and the spacer elements 210 are made of the same material. Many variations and/or modifications can be made to embodiments of the disclosure. In some other embodiments, the spacer elements 220 and the spacer elements 210 are made of different materials. For example, the spacer elements 220 are made of low-K dielectric material while the spacer elements 210 are not made of low-K dielectric material. The term "low-K material" may mean a material having a dielectric constant that is equal to or less than the dielectric constant of silicon dioxide. The spacer elements 220 made of low-K dielectric material can reduce parasitic capacitance and therefore improve operation speed. On the other hand, the spacer elements 210 may be made of a hard and dense material to resist subsequent etching processes.

As shown in FIGS. 5A and 5B, the fin structures 110 are partially removed, in accordance with some embodiments. The fin structures 110 are recessed and become lower than the top surface of the isolation features 150. As a result, multiple trenches 230 are formed. In some embodiments, the depth D of the trenches 230 is in a range from about 20 nm to about 50 nm. In some embodiments, the trenches 230 are V-shaped or have a V-shaped bottom, as shown in FIGS. 5A and 5B. In some embodiments, the trenches 230 expose the (111) crystalline plane of the fin structures 110.

In some embodiments, an etching process is performed to partially remove the fin structures 110. In some embodiments, the etching process includes a wet etching process or another suitable etching process. In some embodiments, the etchant used in the etching process includes a liquid mixture (such as phosphoric acid, another suitable solution, or a combination thereof). In some embodiments, the etchant has a sufficiently high etch selectivity of the fin structures 110. The spacer elements 220 protect the semiconductor wires 120 and 130 from being removed during the formation of the trenches 230.

Figure 6A:
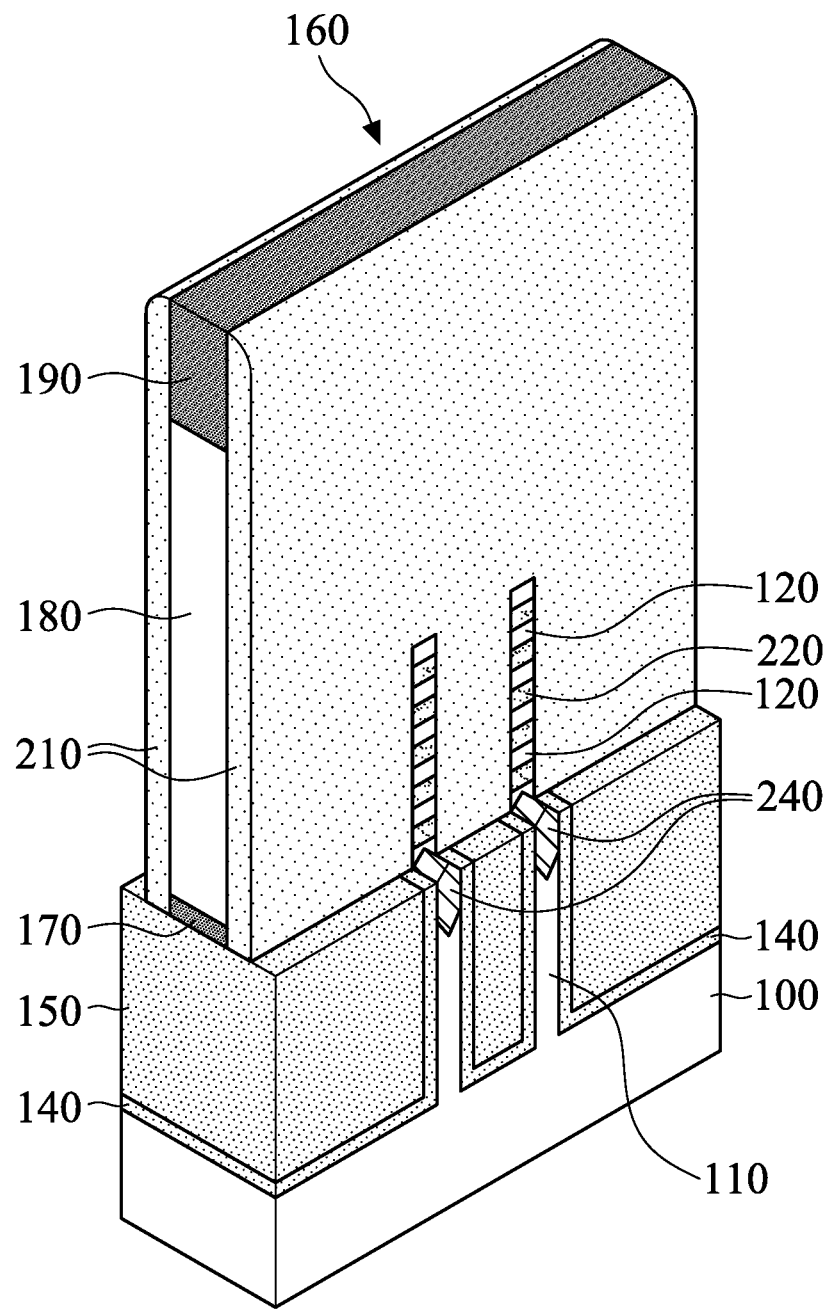
Figure 6B:
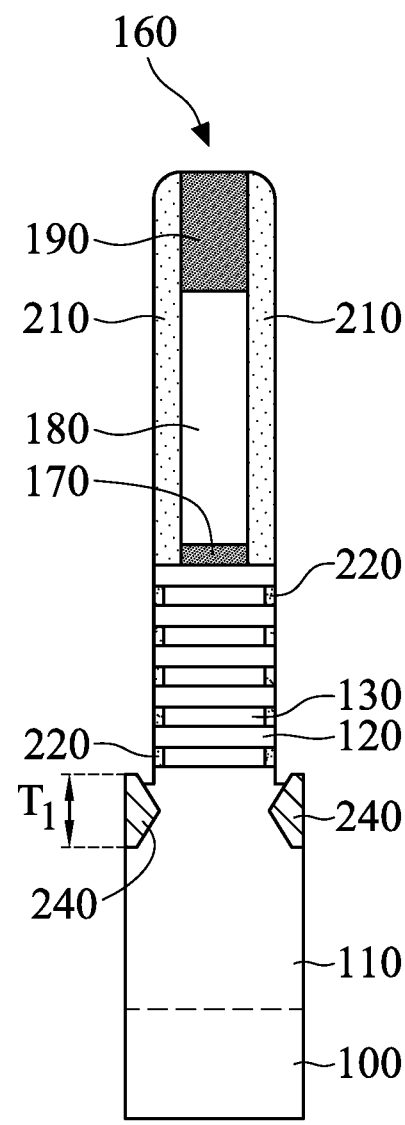

As shown in FIGS. 6A and 6B, multiple strain-relaxed buffer (SRB) structures 240 are formed in the fin structures 110, in accordance with some embodiments. The trenches 230 are filled with the SRB structures 240. As a result, the SRB structures 240 are V-shaped or have a V-shaped portion near the bottom. The SRB structures 240 and the fin structures 110 are surrounded by the isolation features 150. The SRB structures 240 may protrude from the top surfaces of the fin structures 110 and the isolation features 150. In some embodiments, the thickness $T_1$ of the SRB structures 240 is in a range from about 20 nm to about 50 nm. The thickness $T_1$ of the SRB structures 240 may be substantially equal to the depth D of the trenches 230.

In some embodiments, each of the SRB structures 240 is in direct contact with one or more of the fin structures 110. In some embodiments, the SRB structures 240 adjoin the (111) crystalline plane of the fin structures 110. In some embodiments, the SRB structures 240 are separated from the isolation features 150 by the isolation liner 140. In some other embodiments, the isolation liner 140 is not formed and the SRB structures 240 are in direct contact with the isolation features 150.

In some embodiments, the SRB structures 240 are made of or include silicon germanium, silicon carbide, or another suitable epitaxially grown semiconductor material. In some embodiments, the SRB structures 240 do not include dopants. In some embodiments, the SRB structures 240 and the semiconductor wires 120 are made of different materials. The materials of the SRB structures 240 and the semiconductor wires 120 have different lattice constants. For example, the SRB structures 240 may be made of silicon germanium or silicon carbide while the semiconductor wires 120 may be made of silicon. Generally, the lattice constant of silicon is less than the lattice constant of silicon germanium and greater than the lattice constant of silicon carbide. It should be noted that these described materials are merely examples and embodiments of the disclosure are not limited thereto.

The SRB structures 240 and the semiconductor wires 130 may or may not be made of the same material. For example, both the SRB structures 240 and the semiconductor wires 130 may be made of silicon germanium. Alternatively, the SRB structures 240 may be made of silicon carbide while the semiconductor wires 130 may be made of silicon germanium. The SRB structures 240 and the fin structures 110 may or may not be made of different materials. The materials of the SRB structures 240 and the fin structures 110 have different lattice constants. For example, the SRB structures 240 may be made of silicon germanium or silicon carbide while the fin structures 110 may be made of silicon.

In some embodiments, a semiconductor material is epitaxially grown over the exposed fin structures 110 so as to form the SRB structures 240. In some embodiments, the SRB structures 240 are formed using a SEG process, a CVD process, another applicable process, or a combination thereof. Since the semiconductor wires 120 and 130 are covered by the spacer elements 220, it can be ensured that the semiconductor material is precisely grown in the trenches 230 over the fin structures 110. The spacer elements 220 prevent the semiconductor material from being epitaxially grown where it is not desired.

In some embodiments, since the SRB structures 240 are epitaxially grown over the (111) crystalline plane of the fin structures 110, defects (such as vacancies) in the SRB structures 240 are confined within the bottom or the lower portion of the SRB structures 240. For example, there may be vacancies, which are limited in the V-shaped portion of the SRB structures 240, while there are substantially no defects within the top or the upper portion of the SRB structures 240. Accordingly, the upper portion of the SRB structures 240 has a better crystal quality, which will result in a better crystal quality of the source or drain structures formed thereon. Therefore, channel regions of the semiconductor device structure have an improved strain efficiency.

As shown in FIGS. 6A and 6B, the spacer elements 220 are partially removed, in accordance with some embodiments. As a result, the sidewalls of the semiconductor wires 120 are exposed. The sidewalls of the spacer elements 210 are also exposed. Some portions of the spacer elements 220 remain between the semiconductor wires 120. In some embodiments, the remaining portions of the spacer elements 220 are narrower than the spacer elements 210, as shown in FIG. 6B. In some embodiments, an etching process is performed to partially remove the spacer elements 220.

Figure 7A:
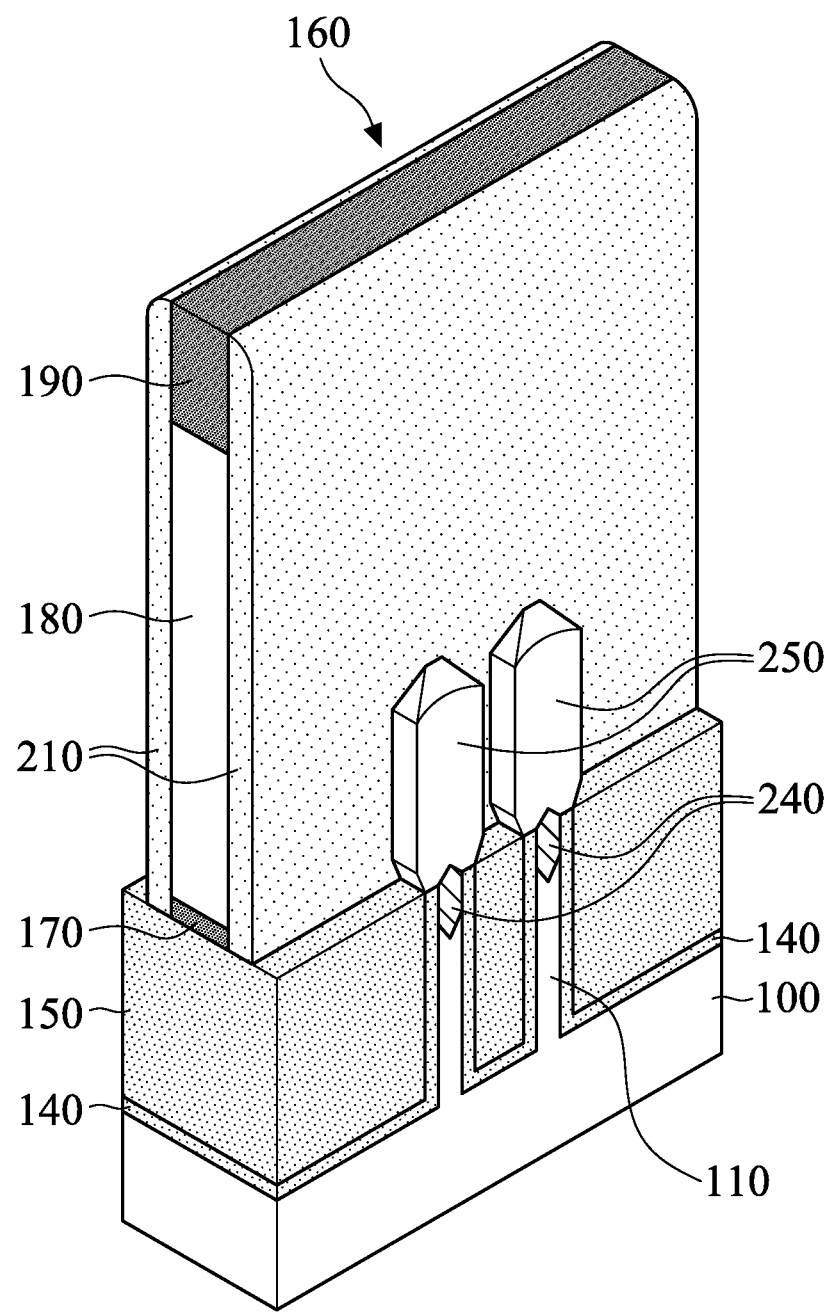
Figure 7B:
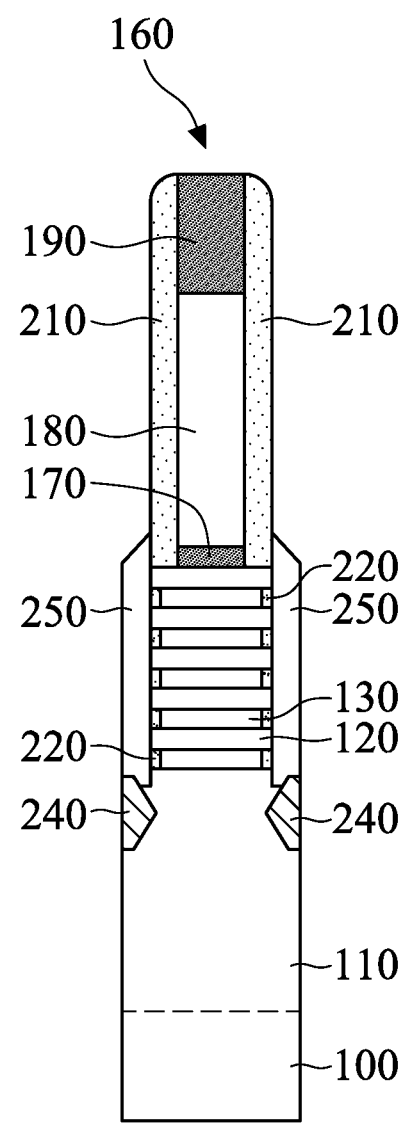

As shown in FIGS. 7A and 7B, source or drain (S/D) structures 250 are formed over the SRB structures 240 and the isolation features 150, in accordance with some embodiments. The S/D structures 250 are positioned on two opposite sides of the semiconductor wires 120 and 130. The S/D structures 250 may be used to provide stress or strain to channel regions. As a result, the carrier mobility of the semiconductor device structure and device performance is improved. The combination of the S/D structures 250 and the SRB structures 240 may be referred to as composite source or drain regions.

As shown in FIG. 7A, the S/D structures 250 are wider than the SRB structures 240. In some embodiments, the width of the SRB structures 240 is substantially equal to the width of the fin structure 110. In some embodiments, the S/D structures 250 are in direct contact with the SRB structures 240, the semiconductor wires 120, the spacer elements 210 and the spacer elements 220. In some embodiments, the spacer elements 220 are laterally sandwiched between the S/D structures 250 and the semiconductor wires 130 so the spacer elements 220 separate the semiconductor wires 130 from the S/D structures 250.

In some embodiments, the S/D structures 250 are a P-type semiconductor material. In some embodiments, the S/D structures 250 are an N-type semiconductor material. The S/D structures 250 may include epitaxially grown silicon, silicon-germanium, epitaxially grown phosphorous-doped silicon (Si:P), boron-doped silicon germanium (SiGe:B), or another suitable semiconductor material.

The materials of the S/D structures 250 and the semiconductor wires 120 have the same lattice constant. The materials of the S/D structures 250 and the semiconductor wires 130 may have different lattice constants. The materials of the S/D structures 250 and the fin structures 110 may have the same lattice constant.

In some embodiments, the materials of the S/D structures 250 and the SRB structures 240 have different lattice constants. For example, the S/D structures 250 may be made of silicon containing N-type dopants while the SRB structures 240 may be made of silicon germanium. Alternatively, the S/D structures 250 may be made of silicon containing P-type dopants while the SRB structures 240 may be made of silicon carbide. It should be noted that these described materials are merely examples and not limitations to the disclosure.

In some embodiments, a semiconductor material (or two or more semiconductor materials) is epitaxially grown over the fin structures 110 so as to form the S/D structures 250. The semiconductor material is deposited using a SEG process, a CVD process (e.g., a VPE process, a LPCVD process, and/or an UHV-CVD process), a molecular beam epitaxy process, deposition of doped amorphous semiconductor followed by a solid-phase epitaxial recrystallization step, another applicable process, or a combination thereof.

In some embodiments, the material of the S/D structures 250 is epitaxially grown over the SRB structures 240 with good crystal quality. The lattice of the S/D structures 250 may be forced to align with the lattice of the upper portion of the SRB structures 240. As a result, the SRB structures 240 provide tensile or compressive stress to the S/D structures 250 and change the arrangement of molecules of the S/D structures 250. The semiconductor device structure has better carrier mobility of electrons or holes.

In some embodiments, the S/D structures 250 are doped with one or more suitable dopants. For example, the S/D structures 250 are Si S/D features doped with phosphorus, arsenic, antimony, or another suitable dopant. Alternatively, the S/D structures 250 are SiGe S/D features doped with boron or another suitable dopant. In some embodiments, multiple implantation processes are performed to dope the S/D structures 250. In some embodiments, the S/D structures 250 are doped in-situ during the growth of the S/D structures 250. In some other embodiments, the S/D structures 250 are not doped during the growth of the S/D structures 250. After the epitaxial growth, the S/D structures 250 are doped in a subsequent process. In some embodiments, doping is achieved using an ion implantation process, a plasma immersion ion implantation process, a gas and/or solid source diffusion process, another applicable process, or a combination thereof. In some embodiments, the S/D structures 250 are further exposed to an annealing process (such as a rapid thermal annealing process) to activate the dopants.

Figure 8A:
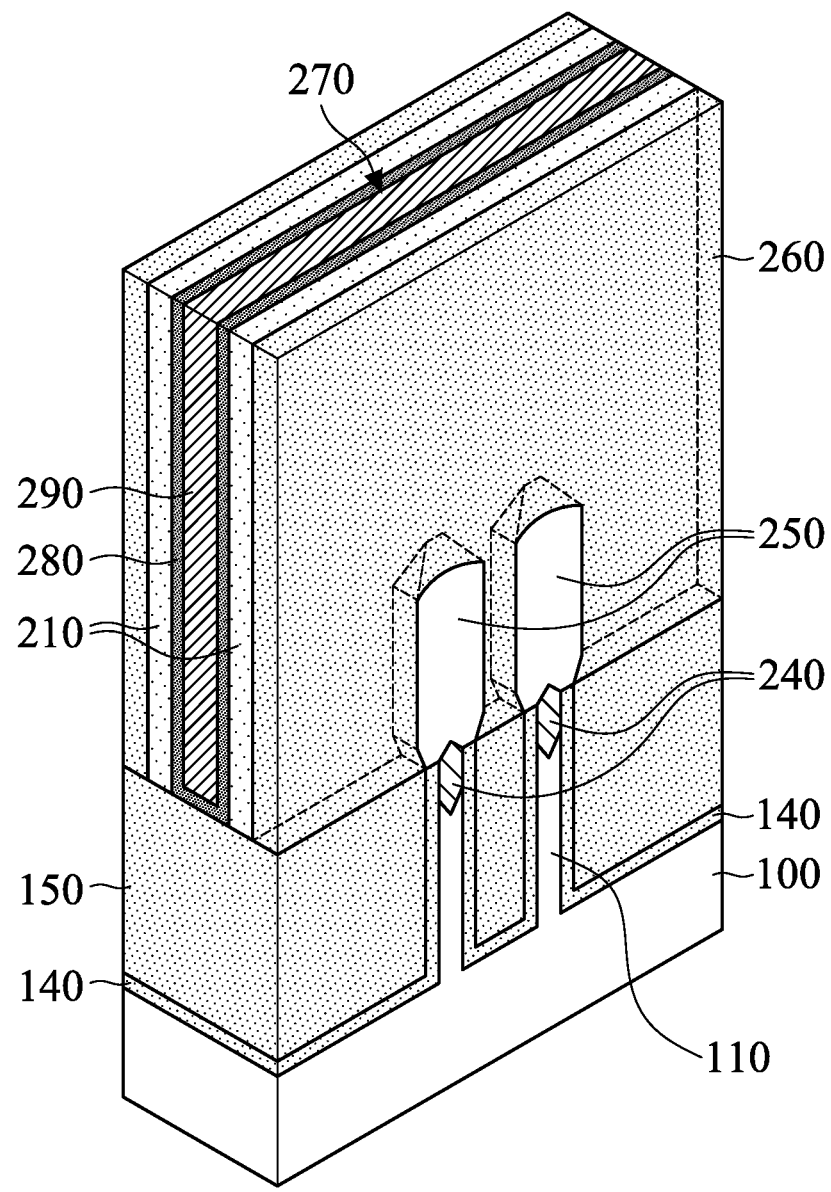
Figure 8B:
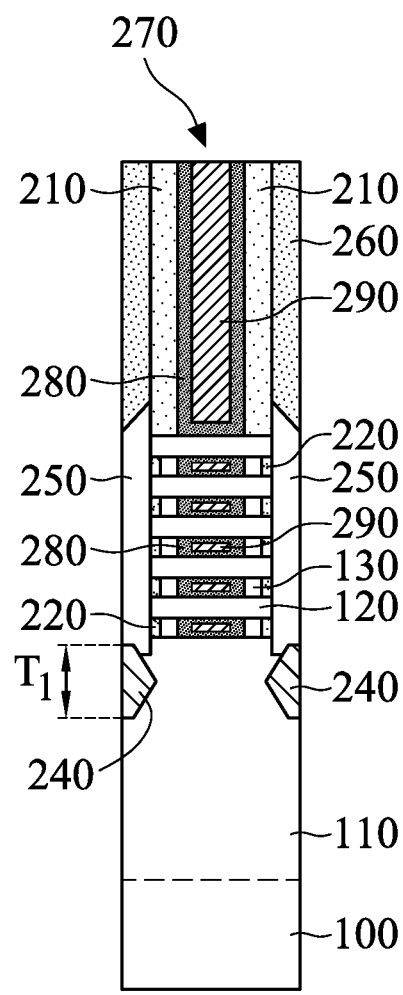

As shown in FIGS. 8A and 8B, a dielectric layer 260 is deposited over the isolation features 150, in accordance with some embodiments. The dielectric layer 260 serves as an interlayer dielectric (ILD) layer. In some embodiments, the dielectric layer 260 is made of silicon oxide, silicon oxynitride, borosilicate glass, phosphosilicate glass, borophosphosilicate glass, fluorinated silicate glass, low-K material, porous dielectric material, another suitable dielectric material, or a combination thereof.

In some embodiments, the dielectric layer 260 covers the isolation features 150, the dummy gate stack 160, the spacer elements 210, and the S/D structures 250. Afterwards, the dielectric layer 260 is thinned down until the dummy gate stack 160 and the spacer elements 210 are exposed. In some embodiments, a planarization process is performed to thin down the dielectric layer 260. The planarization process may include a CMP process, a grinding process, an etching process, another applicable process, or a combination thereof.

Subsequently, the dummy gate stack 160 is removed, in accordance with some embodiments. Some portions of the semiconductor wires 120 and 130 become exposed after the removal of the dummy gate stack 160. The dummy gate stack 160 is removed using a wet etching process, a dry etching process, another applicable process, or a combination thereof.

Afterwards, some exposed portions of the semiconductor wires 130 are removed. As a result, the semiconductor wires 120 are suspended between the S/D structures 250. Some portions of the semiconductor wires 120 serve as channel regions of transistors. In some embodiments, the SRB structures 240 with larger lattice constant located under the bottom of the S/D structures 250 provide tensile stress to the S/D structures 250. The SRB structures 240 with larger lattice constant further induce tensile strain in the channel regions of the semiconductor wires 120. In some embodiments, the SRB structures 240 with smaller lattice constant located under the bottom of the S/D structures 250 provide compressive stress to the S/D structures 250. The SRB structures 240 with smaller lattice constant further induce compressive strain in the channel regions of the semiconductor wires 120.

In some embodiments, an etching process is performed to selectively remove the semiconductor wires 130 without removing the semiconductor wires 120. In some embodiments, the etchant has a sufficiently high etch selectivity of the semiconductor wires 130 to the semiconductor wires 120. The spacer elements 220 may serve as an etch stop layer during the etching process to protect the S/D structures 250.

Although FIG. 8B shows that the semiconductor wires 130 that are not under the spacer elements 210 are removed, embodiments of the disclosure are not limited thereto. Some portions of the semiconductor wires 130 that are not under the spacer elements 210 may be partially left between the semiconductor wires 120.

As shown in FIGS. 8A and 8B, a metal gate stack 270 is formed to fill the space that is formed due to the removal of the semiconductor wires 130, in accordance with some embodiments. The metal gate stack 270 encircles the semiconductor wires 120. In some embodiments, the remaining portions of the semiconductor wires 130 are laterally sandwiched between the metal gate stack 270 and the spacer elements 220. In some embodiments, the remaining portions of the semiconductor wires 130 are narrower than the spacer elements 210, as shown in FIG. 8B. In some embodiments, the spacer elements 220 reduce the parasitic capacitance, such as gate-to-source capacitance ($C_{gd}$) so that the circuit delay time is reduced. Therefore, the semiconductor device structure has enhanced operation speed.

In some embodiments, the metal gate stack 270 includes a gate dielectric layer 280 and a gate electrode 290. In some embodiments, the gate dielectric layer 280 includes a high-k material layer. The term "high-k material" may mean a material having a dielectric constant greater than the dielectric constant of silicon dioxide. The high-K dielectric layer may be made of hafnium oxide, zirconium oxide, aluminum oxide, silicon oxynitride, another suitable high-K material, or a combination thereof.

An interfacial layer (not shown) may be formed underlying the gate dielectric layer 280 to reduce stress between the gate dielectric layer 280 and the semiconductor wires 120. The interfacial layer may include silicon oxide or another suitable material.

In some embodiments, the gate electrode 290 includes a barrier layer, one or more work function layers, a blocking layer, a glue layer, a metal filling layer, one or more other suitable metal gate layers, and a combination thereof. For illustration purposes, the gate electrode 290 shown in figures is a single layer but embodiments of the disclosure are not limited thereto.

More specifically, the barrier layer may be used to interface the gate dielectric layer 280 with the work function layer. The barrier layer may also be used to prevent diffusion between the gate dielectric layer 280 and the work function layer. The blocking layer may be used to prevent the metal filling layer from diffusing or penetrating into the work function layer. The glue layer may be used to increase adhesion between the work function layer and the metal filling layer so as to prevent the metal filling layer from peeling or delaminating. In some embodiments, each of the barrier layer, the blocking layer and the glue layer is made of or includes tantalum nitride, titanium nitride, another suitable material, or a combination thereof. In some embodiments, the metal filling layer is made of or includes tungsten, aluminum, copper, cobalt, another suitable material, or a combination thereof.

The work function layer is used to provide the desired work function for transistors to enhance device performance including improved threshold voltage (Vt). In the embodiments of forming an NMOS transistor, the work function layer can be an N-type metal layer, which is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a PMOS transistor, the work function layer can be a P-type metal layer, which is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, another suitable material, or a combination thereof.

The thickness and/or the compositions of the work function layer may be fine-tuned to adjust the work function level. For example, a titanium nitride layer may be used as a P-type metal layer or an N-type metal layer, depending on the thickness and/or the compositions of the titanium nitride layer.

In some embodiments, the gate dielectric layer 280 and the gate electrode 290 fill the space that is formed due to the removal of the semiconductor wires 130. The excess materials of the gate dielectric layer 280 and the gate electrode 290 are removed using a planarization process (such as a CMP process). The planarization process is performed until the dielectric layer 260 is exposed. As a result, the remaining portions of the gate dielectric layer 280 and the gate electrode 290 form the metal gate stack 270, as shown in FIGS. 8A and 8B.

Figure 9:
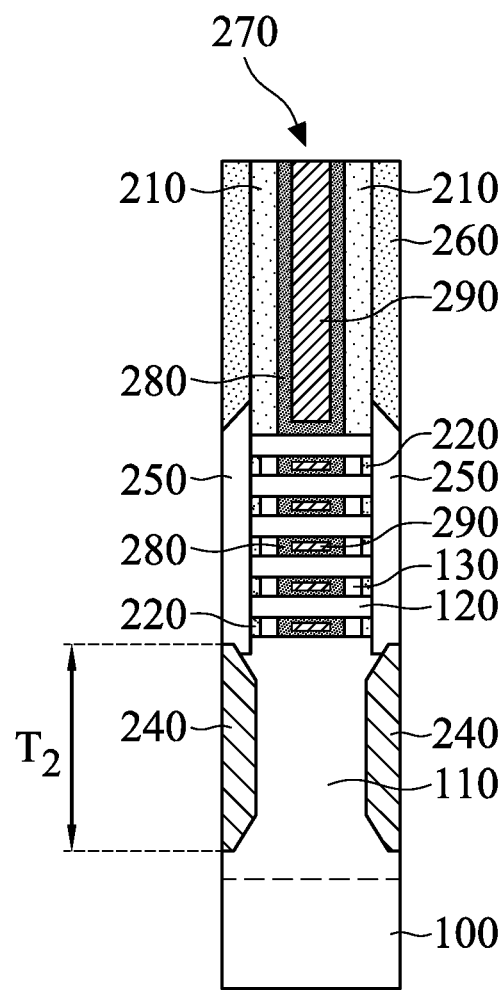
FIG. 9 is a cross-sectional view of a semiconductor device structure, in accordance with some embodiments.

Many variations and/or modifications can be made to embodiments of the disclosure. For example, the dimension of the SRB structures is not limited to those shown in FIGS. 8A and 8B. FIG. 9 is a cross-sectional view of a semiconductor device structure, in accordance with some embodiments. As shown in FIG. 9, a semiconductor device structure similar to that shown in FIG. 8B is provided. In some embodiments, the materials, formation methods, and/or benefits illustrated in the aforementioned embodiments can also be applied in the embodiments illustrated in FIG. 9, and are therefore not repeated.

The SRB structures 240 shown in FIG. 9 are much deeper in the fin structures 110 than the SRB structures 240 shown in FIG. 8B. For example, deeper trenches (such as the trenches 230) are formed in the fin structures 110 so as to form the SRB structures 240 shown in FIG. 9. In other words, the SRB structures 240 shown in FIG. 9 are thicker than the SRB structures 240 shown in FIG. 8B. In some embodiments, the thickness $T_2$ of the SRB structures 240 shown in FIG. 9 is in a range from about 50 nm to about 70 nm.

In some embodiments, the SRB structures 240 shown in FIG. 9 have a V-shaped portion near the bottom. However, embodiments of the disclosure are not limited thereto. In some other embodiments, the SRB structures 240 have a rounded portion near the bottom or another suitable shape. There may be vacancies confined within the bottom or the lower portion of the SRB structures 240. However, there are substantially no defects within the top or the upper portion of the SRB structures 240 since the SRB structures 240 have a greater thickness $T_2$. Accordingly, no matter the SRB structures 240 have a V-shaped portion or not, the upper portion of the deep SRB structures 240 has a better crystal quality, which will result in better crystal quality of the S/D structures 250.

In accordance with some embodiments, the semiconductor device structure is divided into multiple regions 100A and 100B. The aforementioned embodiments can be applied to form the same type transistors (N-type or P-type transistors) in the regions 100A and 100B. Many variations and/or modifications can be made to embodiments of the disclosure. The aforementioned embodiments can also be applied to form an N-type transistor in the region 100A and a P-type transistor in the region 100B.

Figure 10:
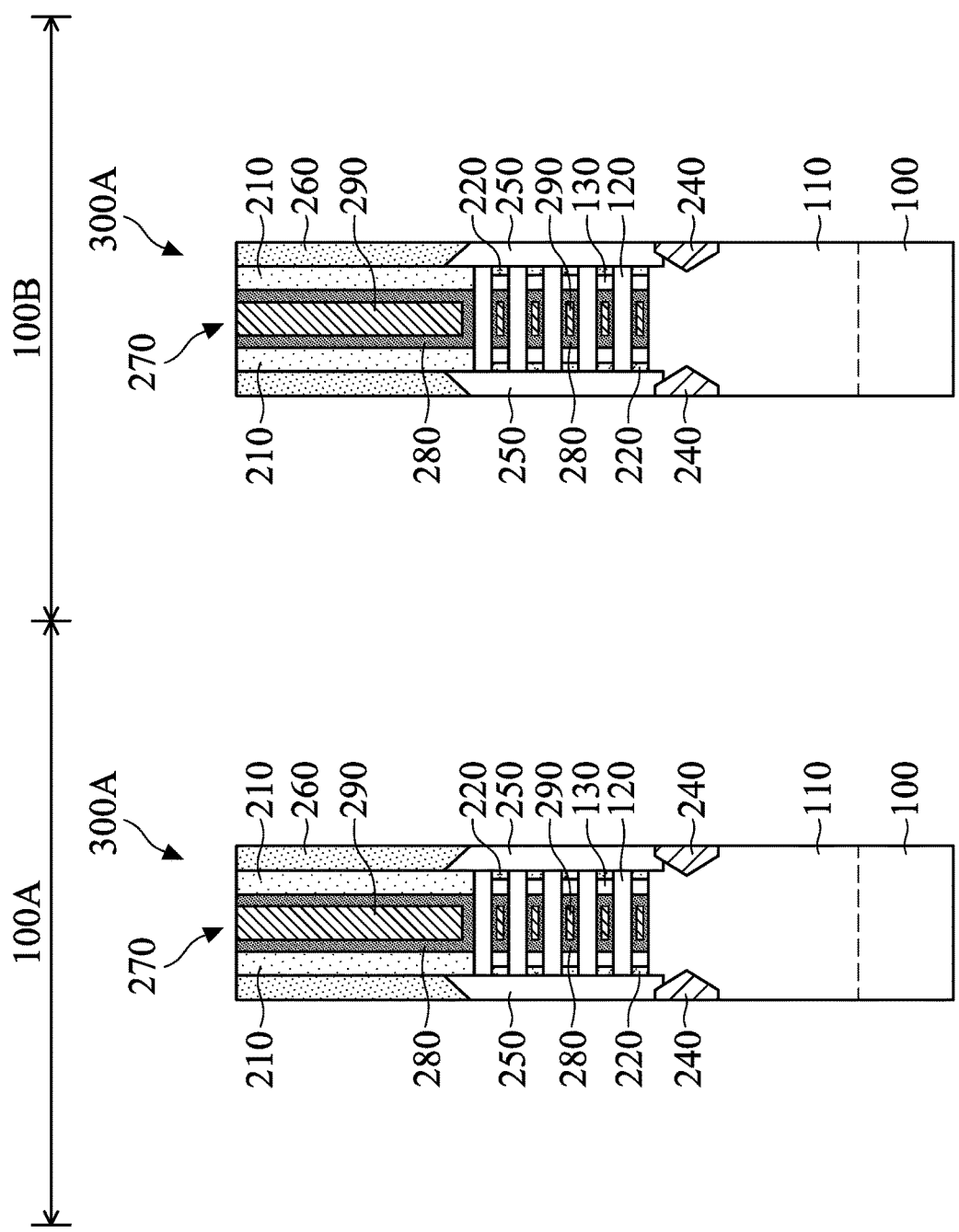
FIG. 10 is a cross-sectional view of a semiconductor device structure, in accordance with some embodiments.
Figure 11:
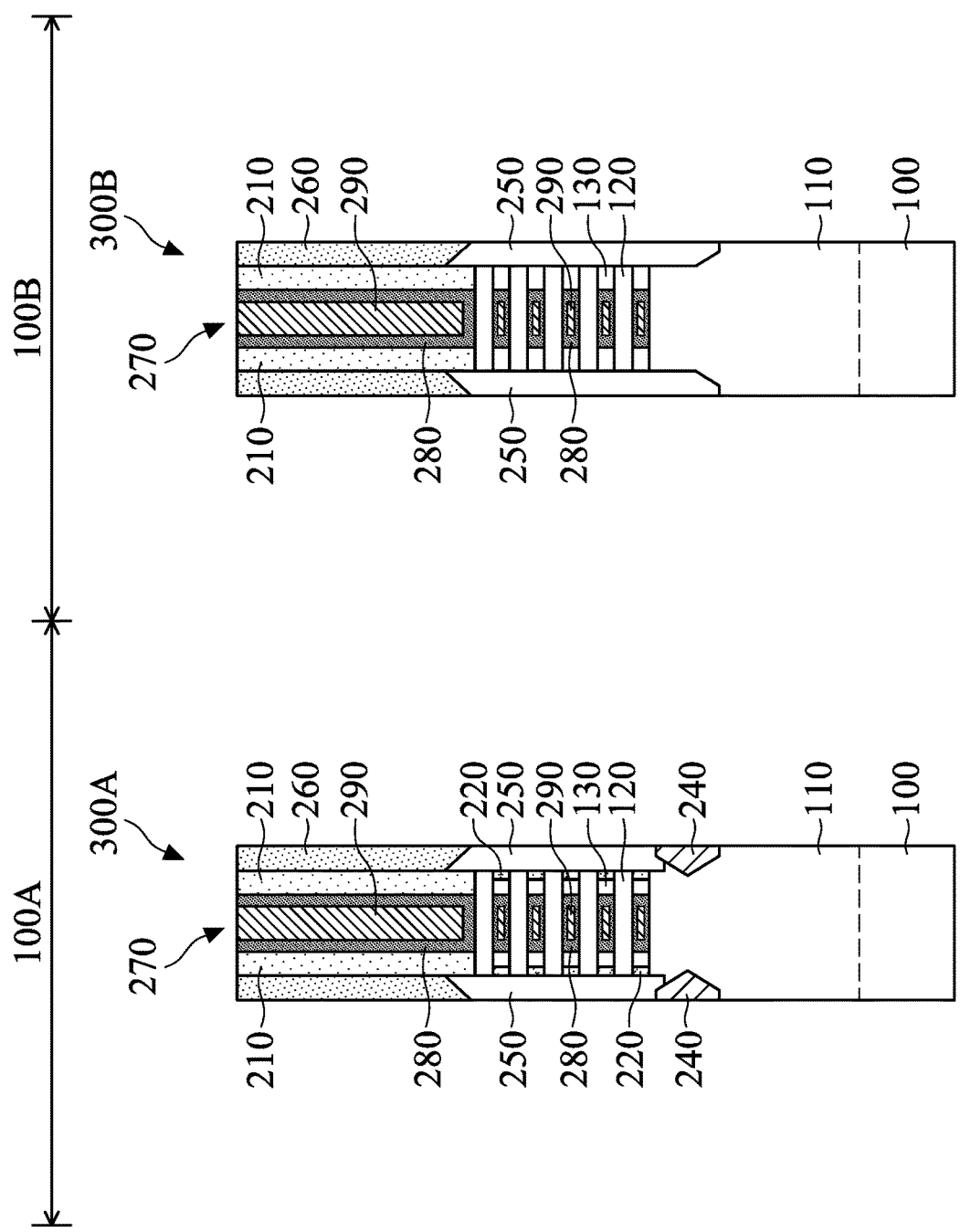
FIG. 11 is a cross-sectional view of a semiconductor device structure, in accordance with some embodiments.
Figure 12:
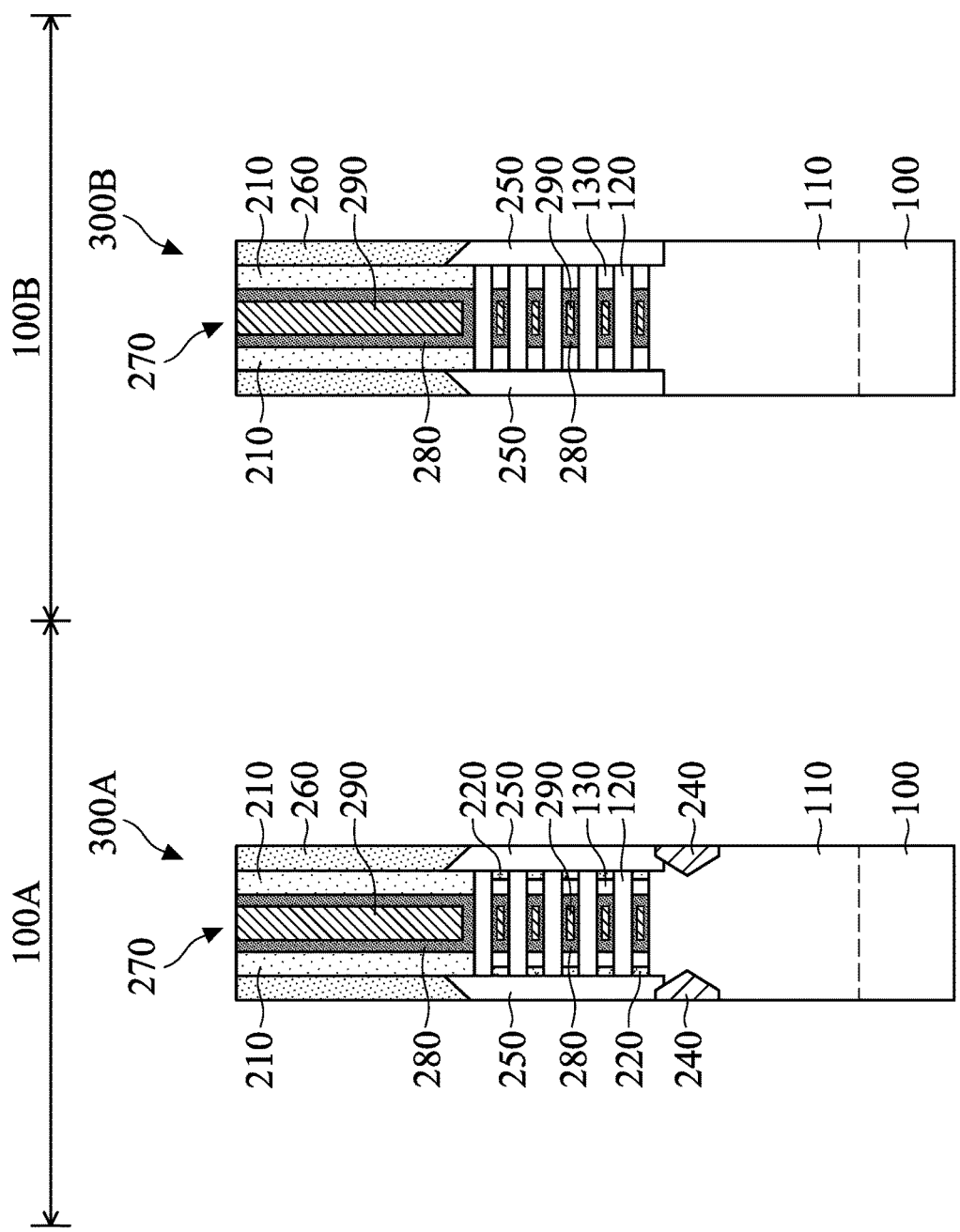
FIG. 12 is a cross-sectional view of a semiconductor device structure, in accordance with some embodiments.

FIGS. 10-12 are cross-sectional views of a semiconductor device structure, in accordance with some embodiments. The materials, formation methods, and/or benefits illustrated in the aforementioned embodiments can be applied in the embodiments illustrated in FIGS. 10-12, and are therefore not repeated.

As shown in FIG. 10, transistors 300A are formed in the regions 100A and 100B. The transistors 300A are substantially the same as the structure shown in FIG. 8B. The transistors 300A in the regions 100A and 100B have the same configuration. In some embodiments, the SRB structures 240 in the regions 100A and 100B are made of or include the same material. The transistors 300A in the regions 100A and 100B are the same type (such as N-type or P-type).

However, embodiments of the disclosure are not limited thereto. In some other embodiments, the SRB structures 240 in the regions 100A and 100B are made of or include different materials. The transistors 300A in the regions 100A and 100B are different types. For example, in the region 100A, the semiconductor wires 120 may be made of silicon, the SRB structures 240 may be made of silicon germanium, and the S/D structures 250 may be made of silicon containing N-type dopants. The transistor 300A in the region 100A is an N-type FET. The SRB structures 240 with larger lattice constant provide tensile stress to the S/D structures 250 and further induce tensile strain in the channel regions of the semiconductor wires 120.

On the other hand, in the region 100B, the semiconductor wires 120 may be made of silicon, the SRB structures 240 may be made of silicon carbide, and the S/D structures 250 may be made of silicon containing P-type dopants. The transistor 300A in the region 100B is a P-type FET. The SRB structures 240 with smaller lattice constant provide compressive stress to the S/D structures 250 and further induce compressive strain in the channel regions of the semiconductor wires 120.

As shown in FIG. 11, a transistor 300A is formed in the region 100A and a transistor 300B is formed in the region 100B. The transistor 300A is substantially the same as the structure shown in FIG. 8B. The transistor 300A in the region 100A and the transistor 300B in the region 100B have different configurations. The transistor 300B does not include spacer elements 220 and SRB structures 240. In some embodiments, the S/D structures 250 of the transistor 300B are in direct contact with the semiconductor wires 130 and the fin structures 110.

In some embodiments, as shown in FIGS. 3A and 3B, the portions of the semiconductor wires 120 and 130 that are not under the dummy gate stack 160 and the spacer elements 210 are removed from the region 100B. The steps shown in FIGS. 4A and 4B are not performed in the region 100B and the spacer elements 220 (shown in FIGS. 5A and 5B) are not formed. Afterwards, the trenches 230 (shown in FIGS. 5A and 5B) are formed in the region 100B. The steps shown in FIGS. 6A and 6B are not performed in the region 100B so the SRB structures 240 are not formed. A semiconductor material is epitaxially grown over the fin structures 110 and fills the trenches 230 so as to form the S/D structures 250 of the transistor 300B. As a result, the S/D structures 250 of the transistor 300B extend into the fin structures 110, as shown in FIG. 11. The S/D structures 250 of the transistor 300B may have a V-shaped portion near the bottom, but embodiments of the disclosure are not limited thereto.

In some embodiments, the transistor 300A in the region 100A is an N-type FET and the transistor 300B in the region 100B is a P-type FET. For example, in the region 100A, the semiconductor wires 120 may be made of silicon, the SRB structures 240 may be made of silicon germanium, and the S/D structures 250 may be made of silicon containing N-type dopants. The SRB structures 240 transfer tensile stress to the S/D structures 250 and induce tensile strain in the channel regions of the semiconductor wires 120. In the region 100B, the semiconductor wires 120 may be made of silicon and the S/D structures 250 may be made of silicon germanium containing P-type dopants. The strained S/D structures 250 provide compressive strain in the channel regions of the semiconductor wires 120.

In some other embodiments, the transistor 300A in the region 100A is a P-type FET and the transistor 300B in the region 100B is an N-type FET. For example, in the region 100A, the semiconductor wires 120 may be made of silicon, the SRB structures 240 may be made of silicon carbide, and the S/D structures 250 may be made of silicon containing P-type dopants. The SRB structures 240 transfer compressive stress to the S/D structures 250 and induce compressive strain in the channel regions of the semiconductor wires 120. In the region 100B, the semiconductor wires 120 may be made of silicon and the S/D structures 250 may be made of silicon carbide containing N-type dopants. The strained S/D structures 250 provide tensile strain in the channel regions of the semiconductor wires 120.

As shown in FIG. 12, a transistor 300A is formed in the region 100A and a transistor 300B is formed in the region 100B. The transistor 300A is substantially the same as the structure shown in FIG. 8B. The transistor 300A in the region 100A and the transistor 300B in the region 100B have different configurations. The transistor 300B shown in FIG. 12 is similar to the transistor 300B shown in FIG. 11. The transistor 300B does not include spacer elements 220 and SRB structures 240. In some embodiments, the S/D structures 250 of the transistor 300B are in direct contact with the semiconductor wires 130.

In some embodiments, as shown in FIGS. 3A and 3B, the portions of the semiconductor wires 120 and 130 that are not under the dummy gate stack 160 and the spacer elements 210 are removed from the region 100B. The steps shown in FIGS. 4A, 4B, 5A, 5B, 6A and 6B are not performed in the region 100B so the spacer elements 220 and the SRB structures 240 are not formed. Afterwards, a semiconductor material is epitaxially grown over the fin structures 110 so as to form the S/D structures 250 of the transistor 300B. As a result, the S/D structures 250 of the transistor 300B do not extend into the fin structures 110, as shown in FIG. 12. The S/D structures 250 of the transistor 300B may not have a V-shaped portion near the bottom.

Many variations and/or modifications can be made to embodiments of the disclosure. For example, the SRB structures 240 of the transistor 300A and/or the transistor 300B shown in FIGS. 10-12 may be replaced by the SRB structures 240 shown in FIG. 9.

Embodiments of the disclosure can be applied to not only a semiconductor device structure with GAA transistors but also a semiconductor device structure with FinFETs (not shown). In some embodiments, the materials and/or formation methods of a semiconductor device structure with FinFETs are similar to those of the described semiconductor device structure. The semiconductor device structure with FinFETs includes fin structures and the described SRB structures at the bottom of source and drain. Similar to the aforementioned embodiments, the materials of the source or drain and the fin structures have the same lattice constant. The materials of the source or drain and the SRB structures have different lattice constants so as to provide tensile or compressive stress to the source or drain. Embodiments of the disclosure are not limited and may be applied to fabrication processes for any suitable technology generation.

Embodiments of the disclosure form a semiconductor device structure with a channel region (such as a nanowire or a fin structure) and a composite source or drain region. The composite source or drain region includes a source or drain structure and a strain-relaxed buffer (SRB) structure under the source or drain structure. The lattice of the source or drain structure substantially align with the lattice of the upper portion of the SRB structure. In some embodiments, the material of the SRB structure is selected to have a greater lattice constant than the material of the channel region and the source or drain structure. As a result, the SRB structure not only provides tensile stress to the source or drain structures but also induces tensile strain in the channel region. In some other embodiments, the material of the SRB structure is selected to have a smaller lattice constant than the material of the channel region and the source or drain structure. As a result, the SRB structure not only provides compressive stress to the source or drain structures but also induces compressive strain in the channel region. According to these embodiments, the carrier mobility of the semiconductor device structure is increased and adjustable to meet requirements. Therefore, the device performance of the semiconductor device structure can be significantly improved.

In accordance with some embodiments, the SRB structure is V-shaped or has a V-shaped bottom. The SRB structure is epitaxially grown over the (111) crystalline plane. As a result, defects (such as vacancies) in the SRB structure are confined within the bottom or the lower portion of the SRB structure. There are substantially no defects within the top or the upper portion of the SRB structure. Accordingly, both the SRB structure and the source or drain structure have a better crystal quality. The strain efficiency of channel regions is greatly enhanced.

In accordance with some embodiments, a semiconductor device structure is provided. The semiconductor device structure includes a fin structure over a semiconductor substrate. The semiconductor device structure also includes semiconductor wires stacked over the fin structure. The semiconductor device structure further includes a gate stack over the fin structure. The semiconductor wires are surrounded by the gate stack. In addition, the semiconductor device structure includes source or drain structures over the fin structure and on opposite sides of the semiconductor wires. The semiconductor device structure also includes strain-relaxed buffer structures between the source or drain structures and the fin structure. The strain-relaxed buffer structures and the semiconductor wires have different lattice constants.

In accordance with some embodiments, a semiconductor device structure is provided. The semiconductor device structure includes a first transistor over a semiconductor substrate. The first transistor includes first semiconductor wires having a first lattice constant. The first transistor also includes a first gate stack surrounding the first semiconductor wires. The first transistor further includes first spacer elements over the first semiconductor wires and on opposite sides of the first gate stack. In addition, the first transistor includes second spacer elements between the first semiconductor wires. The first transistor also includes first composite source or drain regions on opposite sides of the first semiconductor wires. The first composite source or drain regions include a first buffer structure and a first source or drain structure covering the first buffer structure. The first buffer structure has a second lattice constant that is different from the first lattice constant.

In accordance with some embodiments, a semiconductor device structure is provided. The semiconductor device structure includes a fin structure over a semiconductor substrate. The semiconductor device structure also includes a source or drain structure over the fin structure. The semiconductor device structure further includes a strain-relaxed buffer structure between the source or drain structure and the fin structure. In addition, the semiconductor device structure includes an isolation feature over the semiconductor substrate and below the source or drain structure. The isolation feature surrounds the fin structure and the strain-relaxed buffer structure. The semiconductor device structure also includes a dielectric layer covering the isolation feature and surrounding the source or drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a fin structure over a semiconductor substrate;
   semiconductor wires stacked over the fin structure;
   a gate stack over the fin structure, wherein the semiconductor wires are surrounded by the gate stack;
   source or drain structures over the fin structure and on opposite sides of the semiconductor wires;
   strain-relaxed buffer structures between the source or drain structures and the fin structure, wherein the strain-relaxed buffer structures and the semiconductor wires have different lattice constants; and
   an isolation feature surrounding the fin structure and the strain-relaxed buffer structures, wherein the strain-relaxed buffer structures protrude from a top surface of the isolation feature.

2. The semiconductor device structure as claimed in claim 1, wherein the strain-relaxed buffer structures have a V-shaped bottom.

3. The semiconductor device structure as claimed in claim 1, further comprising:
   first spacer elements over the fin structure and on opposite sides of the gate stack; and
   second spacer elements between the semiconductor wires.

4. The semiconductor device structure as claimed in claim 3, wherein the second spacer elements are narrower than the first spacer elements.

5. The semiconductor device structure as claimed in claim 3, wherein the first spacer elements and the second spacer elements comprise different dielectric materials.

6. The semiconductor device structure as claimed in claim 3, wherein the source or drain structures are in contact with the semiconductor wires, the first spacer elements and the second spacer elements.

7. The semiconductor device structure as claimed in claim 1, wherein the semiconductor wires are narrower than the fin structure.

8. The semiconductor device structure as claimed in claim 1, wherein the semiconductor wires comprise a semiconductor material, and the source or drain structures comprise the semiconductor material.

9. The semiconductor device structure as claimed in claim 1, wherein the strain-relaxed buffer structures are embedded in the fin structure.

10. A semiconductor device structure, comprising:
a first transistor over a semiconductor substrate, wherein the first transistor comprises:
first semiconductor wires having a first lattice constant;
a first gate stack surrounding the first semiconductor wires;
first spacer elements over the first semiconductor wires and on opposite sides of the first gate stack;
second spacer elements between the first semiconductor wires; and
first composite source or drain regions on opposite sides of the first semiconductor wires, wherein the first composite source or drain regions comprise a first buffer structure and a first source or drain structure covering the first buffer structure, and wherein the first buffer structure has a second lattice constant that is different from the first lattice constant; and
a second semiconductor wire between the first semiconductor wires, wherein the second semiconductor wire is separated from the first source or drain region structure.

11. The semiconductor device structure as claimed in claim 10, further comprising a second transistor over the semiconductor substrate, wherein the second transistor comprises:
second semiconductor wires having the first lattice constant;
a second gate stack surrounding the second semiconductor wires; and
second composite source or drain regions on opposite sides of the second semiconductor wires, wherein the second composite source or drain regions comprise a second buffer structure and a second source or drain structure covering the second buffer structure, and wherein the second buffer structure has a third lattice constant that is different from the first lattice constant.

12. The semiconductor device structure as claimed in claim 11, wherein the third lattice constant is different from the first lattice constant and the second lattice constant.

13. The semiconductor device structure as claimed in claim 10, further comprising a second transistor over the semiconductor substrate, wherein the second transistor comprises:

second semiconductor wires having the first lattice constant;
a second gate stack surrounding the second semiconductor wires; and
second source or drain regions on opposite sides of the second semiconductor wires, wherein the first source or drain structure has the first lattice constant, and the second source or drain regions has a third lattice constant that is different from the first lattice constant.

14. The semiconductor device structure as claimed in claim 13, wherein the first composite source or drain regions and the second source or drain regions have a V-shaped bottom.

15. The semiconductor device structure as claimed in claim 13, wherein bottoms of the first composite source or drain regions and the second source or drain regions are different shapes.

16. The semiconductor device structure as claimed in claim 10, further comprising an isolation feature over the semiconductor substrate and below the first source or drain structure, wherein the first buffer structure protrude from a top surface of the isolation feature.

17. A semiconductor device structure, comprising:
a fin structure over a semiconductor substrate;
a source or drain structure over the fin structure;
a strain-relaxed buffer structure between the source or drain structure and the fin structure;
an isolation feature over the semiconductor substrate and below the source or drain structure, wherein the isolation feature surrounds the fin structure and the strain-relaxed buffer structure;
a dielectric layer covering the isolation feature and surrounding the source or drain structure; and
an isolation liner between the isolation feature and the fin structure, wherein the isolation liner further extends between the isolation feature and the strain-relaxed buffer structure.

18. The semiconductor device structure as claimed in claim 17, wherein the source or drain structure is wider than the strain-relaxed buffer structure.

19. The semiconductor device structure as claimed in claim 17, wherein a width of the strain-relaxed buffer structure is substantially equal to a width of the fin structure.

20. The semiconductor device structure as claimed in claim 17, wherein the strain-relaxed buffer structure and the fin structure have different lattice constants.

* * * * *